(12) United States Patent
Pain

(10) Patent No.: US 6,384,413 B1
(45) Date of Patent: May 7, 2002

(54) FOCAL PLANE INFRARED READOUT CIRCUIT

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/416,964

(22) Filed: Oct. 13, 1999

Related U.S. Application Data

(60) Provisional application No. 60/104,176, filed on Oct. 13, 1998.

(51) Int. Cl.$^7$ .............................. G02F 1/01; G01T 1/105
(52) U.S. Cl. ........................ 250/330; 250/581; 250/584
(58) Field of Search ................................ 250/330, 332, 250/584, 581, 580; 330/252, 250, 265, 262, 277

(56) References Cited

U.S. PATENT DOCUMENTS 5,515,003 A  * 5/1996  Kimura ...................... 330/253

OTHER PUBLICATIONS

Niblack et al., Multiplexed focal plane array upgrade for the A Viris Westrick, 04/93, SPIE vol. 1946 Infrared Detectors and instrumentation.

Blessinger, Comparative study of linear multiplexer designs for a remote sensing application, 04/94, SPIE vol. 2226 Infrared Readout Electronics.

Mendis et al., Low–light–level image sensor with on–chip signal processing, 04/93, SPIE vol. 1952.

Bluzer et al., Current readout of infrared detectors, 03/87, Optical Engineering vol. 26 No. 3.

Nelson et al., General noise processes in hybrid infrared focal plane arrays, 11/91, Optical Engineering vol. 30 No. 11.

* cited by examiner

Primary Examiner—Hung Xuan Dang
(74) Attorney, Agent, or Firm—Fish & Richardson PC

(57) ABSTRACT

An infrared imager, such as a spectrometer, includes multiple infrared photodetectors and readout circuits for reading out signals from the photodetectors. Each readout circuit includes a buffered direct injection input circuit including a differential amplifier with active feedback provided through an injection transistor. The differential amplifier includes a pair of input transistors, a pair of cascode transistors and a current mirror load. Photocurrent from a photodetector can be injected onto an integration capacitor in the readout circuit with high injection efficiency at high speed. A high speed, low noise, wide dynamic range linear infrared multiplexer array for reading out infrared detectors with large capacitances can be achieved even when short exposure times are used. The effect of image lag can be reduced.

29 Claims, 4 Drawing Sheets

FOCAL PLANE INFRARED READOUT CIRCUIT

CROSS REFERENCE TO RELATED APPLICATION

This application claims the benefit of U.S. Provisional Application No. 60/104,176, filed on Oct. 13, 1998.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND

The present disclosure relates, in general, to image sensors and, in particular, to focal plane infrared readout circuits.

In general, image sensors find applications in a wide variety of fields, including machine vision, robotics, guidance and navigation, automotive applications, and consumer products. Imaging systems that operate in the infrared (IR) wavelength region are required for a number of space-based or airborne applications such as monitoring global atmospheric temperature profiles, relative humidity profiles, cloud characteristics and the distribution of minor constituents in the atmosphere. Such IR imaging systems also can be used for fire prevention and control, for enhanced visibility in foggy conditions, and for spectroscopic applications.

In general, focal planes used in imaging applications typically operate with a relatively long exposure or integration time to improve the signal-to-noise ratio. However, for airborne applications, using a long exposure time represents a trade off between tolerable motion blur and the required signal-to-noise ratio. The required signal-to-noise ratio for airborne spectrometers is usually quite strict because the signal collected by each photodetector is reduced by the number of spectral channels.

Time-delay-integration (TDI) is one technique for achieving a low noise level by increasing the effective integration time without introducing motion blur. However, the use of a mechanical scanning arrangement for imaging spectrometry applications precludes the use of TDI techniques for enhancing the signal-to-noise ratio. Instead, the size of the photodetectors is increased. The increased detector size, however, results in a higher detector capacitance.

FIG. 1 illustrates a photodetector represented schematically by a current source in parallel with a variable resistor and a capacitor. A large detector resistance ($R_d$) allows the direct current (dc) component of the injection efficiency to be nearly unity. A high detector capacitance ($C_d$) reduces the cut-off frequency for the injection efficiency, causing problems for circuit operation at high speeds or short exposure times. In particular, a large detector capacitance prevents the detector node from being charged or discharged at high speed, causing the current signal injected into the readout circuit to lag behind the detector current. Retention of charges on the photodetector caused by a large response time constant produces an output that depends on the amount of detector current from the previous frame. That can result in the appearance of a residual, or "ghost," image. The presence of such residual images can cause significant errors in the estimation of ground and atmospheric constituents which are based on the ratios of detector outputs. Therefore, achieving a low noise readout at short exposure times for detectors with a large capacitance poses a major challenge for focal plane multiplexer design.

SUMMARY

In general, according to one aspect, an integrated circuit for reading out signals from a sensor includes a buffered direct injection input circuit including a differential amplifier with an injection transistor coupled between an input and output of the differential amplifier to provide active feedback. The differential amplifier can include a pair of input transistors and a pair of cascode transistors, as well as a current mirror load.

The integrated circuit can be used in various applications including infrared imagers, such as spectrometers, that include multiple infrared photodetectors and readout circuits for reading out signals from the photodetectors. Each readout circuit can include a buffered direct injection input circuit.

Various implementations include one or more of the following features. The cascode transistors can be arranged to reduce an input-to-output capacitance of the differential amplifier. For example, each cascode transistor can have a respective gate and source/drain regions. The gates of the cascode transistors can be electrically coupled to a common voltage and a source/drain region of each cascode transistor can be coupled to a respective source/drain region of one of the input transistors.

Each readout circuit can include an integration capacitor so that, during operation, photocurrent from an associated one the sensors is injected onto the integration capacitor through the injection transistor. Additionally, a feedback capacitor can be coupled between the output of the differential amplifier and the input transistor to which the output of the associated one of the sensors is coupled. The differential amplifier can have an effective input capacitance less than a capacitance of the integration capacitor. Furthermore, the integration capacitor can be reset by applying a reset voltage to a gate of a transistor in parallel with the integration capacitor.

A screen transistor can be coupled between the injection transistor and the integration capacitor. During operation, the screen transistor is preferably biased in saturation.

In another aspect, a method of using an imager includes detecting radiation with infrared sensors having respective capacitances at least as high as about 10 picofarads and injecting photocurrent from each sensor into an associated readout circuit having a buffered direct injection input circuit and an input impedance that is smaller than an impedance of the sensor. The photocurrent injected into each readout circuit is sampled at least once every 100 microseconds.

Various implementations include one or more of the following advantages. Photocurrent can be injected onto the integration capacitor with high injection efficiency at high speed. A high speed, low noise, wide dynamic range linear infrared multiplexer array for reading out infrared detectors with large capacitances can be achieved even when short exposure times are used. The effect of image lag can, therefore, be reduced.

To achieve high-speed BDI operation, the amplifier output resistance can be kept low to increase the amplifier cut-off frequency. A relatively high gain can be achieved by using transistors with large size to increase the transconductance and by using FETs with long device length to reduce short channel effects and provide a large output resistance. The cascade configuration can help reduce input-to-output capacitance.

Additionally, the feedback capacitor can help reduce overshoots during rising transitions. The screen FET can help reduce errors caused by channel length modulation.

Other features and advantages will be readily apparent from the following description, accompanying drawings and the claims.

DETAILED DESCRIPTION

Figure 1:
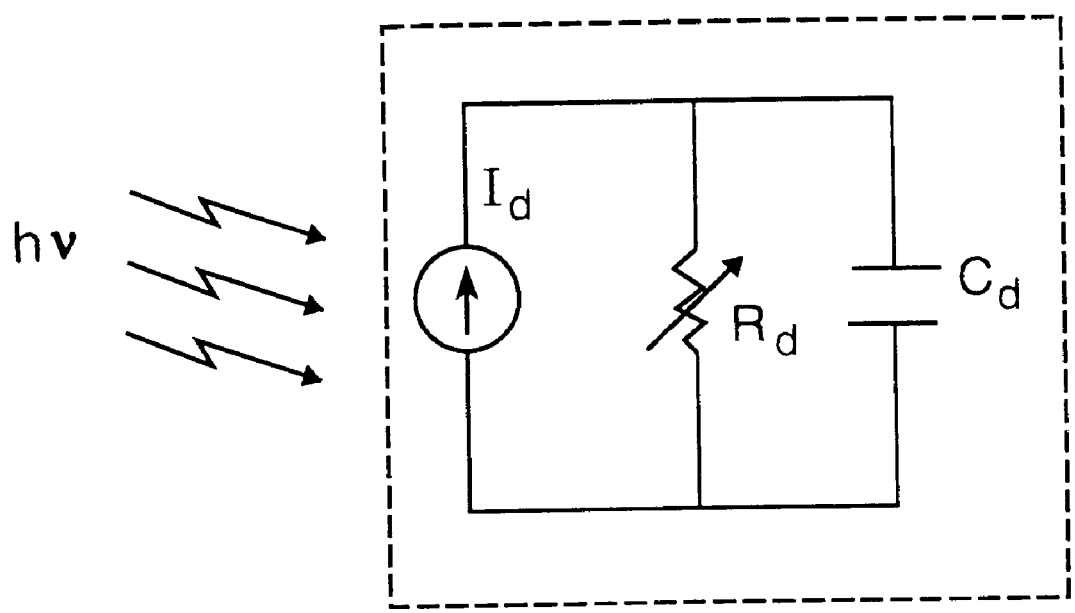
FIG. 1 is a schematic representation of a photodetector.
Figure 2:
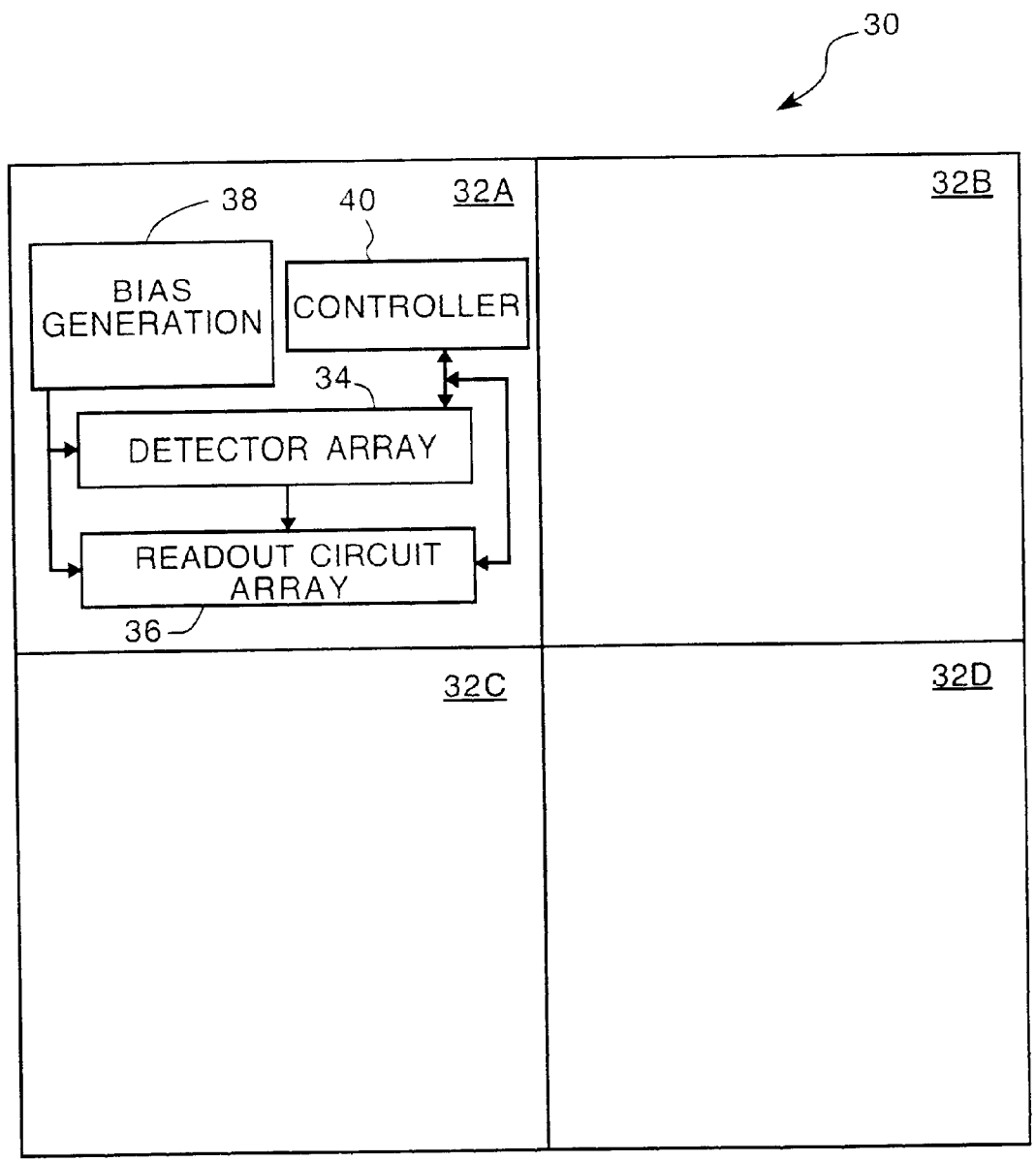
FIG. 2 is a block diagram of part of an infrared imager according to the invention.

FIG. 2 shows an exemplary imaging spectrometer 30 that includes four focal plane planes 32A, 32B, 32C and 32D. Each focal plane, such as the focal plane 32A, has an array 34 of photodetectors. In one implementation, each focal plane includes sixty-four detectors, providing more than 200 spectral bands of information for each ground pixel. A scanning mirror arrangement can be used and covers 614 ground pixels cross-track per scan. To prevent motion blur, the exposure per ground pixel can be limited to less than about 100 microseconds ($\mu$sec). For example, in one implementation, exposure times of about 87.5 $\mu$sec and as little as 50 $\mu$sec can be used.

In one particular implementation, the array 34 includes both silicon (Si) and indium antimonide (InSb) photodiodes to cover the visible and short wavelength infrared spectrum, with the InSb detectors used for the infrared end of the spectrum. Si and InSb photodiodes both have large detector resistances, typically greater than ten giga-ohms (G$\Omega$). To achieve a sufficiently large signal-to-noise ratio, the size of the detectors varies from 200 square microns ($\mu m^2$) to about 200 $\mu$m×400 $\mu$m, causing the detector capacitance to be in the range of about 10 to 30 picofarads (pF). Other detector types, sizes and capacitances also can be used.

Each focal plane, such as the focal plane 32A, also includes an array 36 of readout circuits corresponding to the detector array 34. Outputs from the array of readout circuits can be multiplexed onto a bus (not shown in FIG. 2) for further processing. In addition, each focal plane has bias generation circuitry 38 and a digital controller 40 that provides bi-directional scanning of the readout circuits. In some cases, the size of the detectors may be much larger than the size of the unit cell readout circuit. Accordingly, fan-out boards can be used to provide the connections between the detector array and the readout circuit array. The focal plane can be operated, for example, at liquid nitrogen temperature of about 77 kelvin (K).

Figure 3:
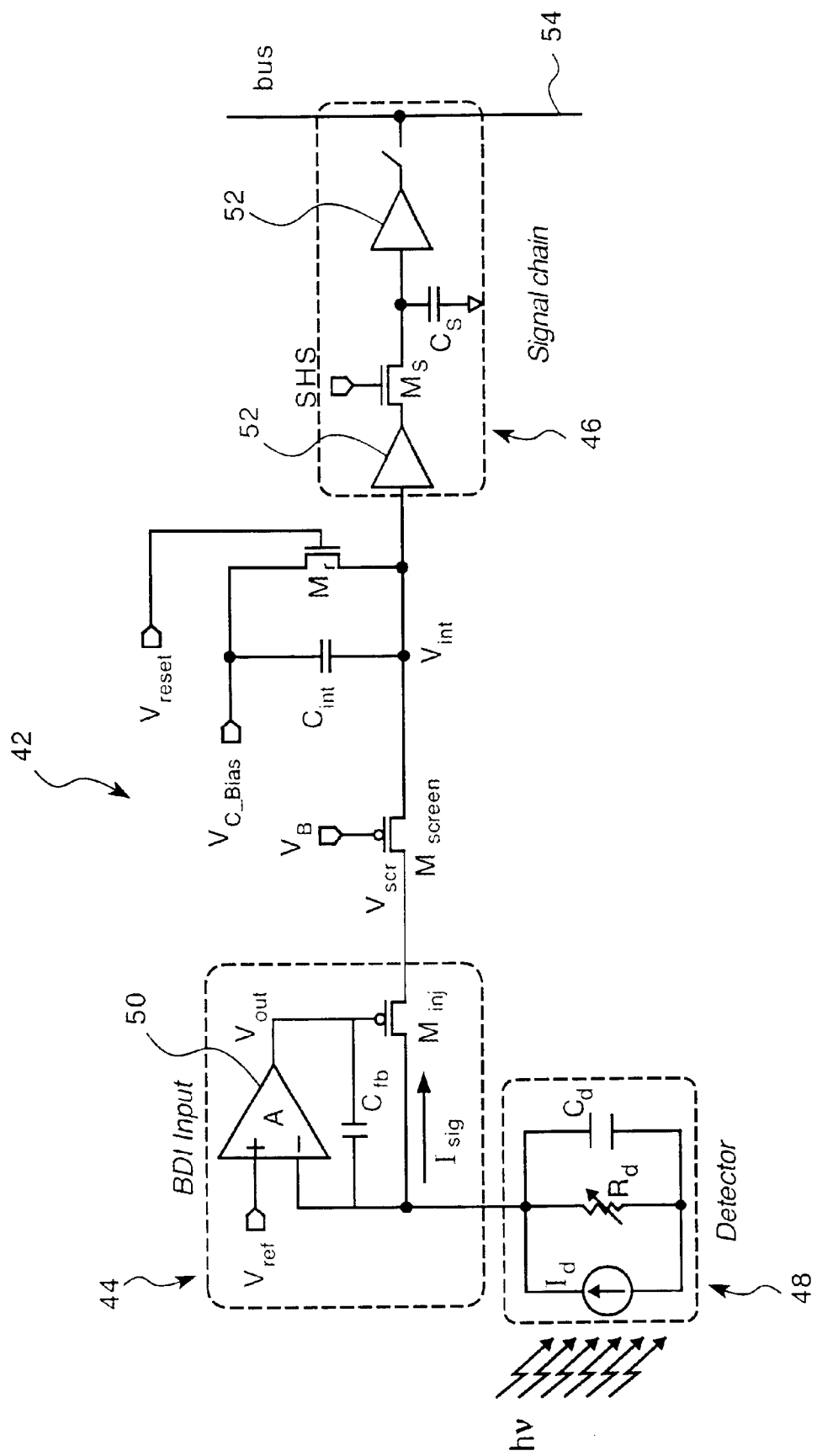
FIG. 3 is a schematic circuit diagram illustrating a readout circuit according to the invention.

As shown in FIG. 3, a unit cell readout circuit 42 includes a buffered direct injection (BDI) input circuit 44 and a single-ended readout signal chain 46. In FIG. 3, the photodetector 48 is represented schematically by a current source in parallel with a variable resistor and a capacitor.

The BDI input circuit 44 provides the required bias stability for the photodetector 48 and allows the input impedance of the readout circuit to be smaller than the detector impedance so that the photocurrent is injected into the readout circuit rather than being integrated on the detector. The BDI input circuit 44 uses a single-ended differential amplifier 50 with active feedback provided through an injection field effect transistor (FET) $M_{inj}$ to ensure minimal voltage variations at the detector node. Photocurrent is injected through the injection FET $M_{inj}$ onto an integration capacitor $C_{int}$ with high injection efficiency at high speed.

A reference voltage $V_{ref}$ is provided to the positive input of the differential amplifier 50, and the output of the photodetector 48 is provided to the negative input of the differential amplifier. To minimize overshoot during rising transitions, a small feedback capacitor $C_{fb}$ can be provided. As illustrated in FIG. 3, the feedback capacitor $C_{fb}$ is coupled between the output of the differential amplifier 50 and the input to which the photodetector output is coupled. Preferably, the capacitance of the feedback capacitor $C_{fb}$ is equal to or less than about fifty femtofarads (fF). Further details of an exemplary differential amplifier 50 are discussed below.

To reduce errors caused by channel length modulation, a screen FET $M_{screen}$ is provided between the injection FET $M_{inj}$ and the integration capacitor $C_{inj}$. The screen FET $M_{screen}$ acts as a cascode transistor to hold the drain of the injection FET $M_{inj}$ at a substantially constant voltage $V_{scr}$. During operation, the screen FET $M_{screen}$ is biased in saturation. The maximum linear swing at the node identified by the voltage $V_{int}$ is approximately $V_B + |V_T| - 5\phi_T$, where $V_B$ is the bias voltage applied to the gate of the screen FET, $V_T$ is the threshold voltage of the screen FET, and $\phi_T$ is the thermal potential.

The value of the integration capacitor $C_{int}$, represents a tradeoff between the maximum signal handling capacity, the transfer gain, and the conversion linearity. An exemplary value for the integration capacitor $C_{int}$ is 0.2 picofarads (pF). The integration capacitor $C_{int}$ can be reset by applying a reset voltage $V_{reset}$ to the gate of the transistor $M_r$ in parallel with the integration capacitor.

As shown in FIG. 3, the readout signal chain 46 includes a chain of one or more source followers 52 and a sample and hold circuit. The sample and hold circuit includes a transistor $M_s$, whose state is controlled by a signal SHS applied to its gate, and a capacitor $C_s$. Periodically, for example, every 87.45 $\mu$sec, each of the unit cell outputs are sampled simultaneously onto their respective sampling capacitors $C_s$ to provide a snap-shot mode of operation. The sampled signals can then be read out serially onto a common bus 54 for further processing. In one implementation, the signals are read onto the bus 54 at a rate of about 750 kHz. In some implementations, it may be desirable to provide a differential readout circuit comprising a pair of sample and hold circuits to allow correlated double sampling to be performed at the pixel level to reduce the noise further.

Figure 4:
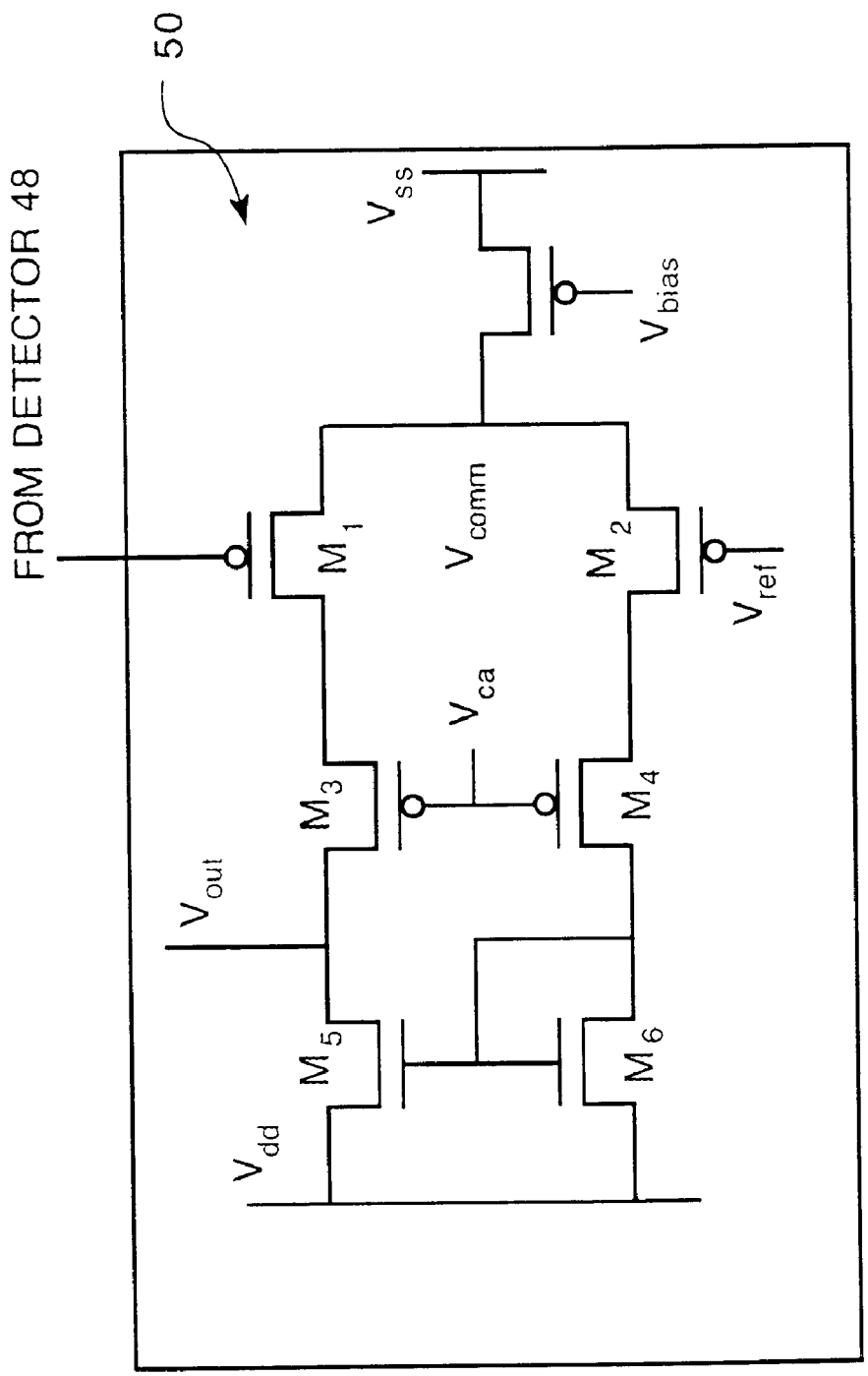
FIG. 4 illustrates an exemplary differential amplifier for use in a buffered direct injection input circuit according to the invention.

To achieve high injection efficiency at high speeds, the amplifier 50 in the BDI input circuit 44 should have a high gain as well as a high cut-off frequency. FIG. 4 illustrates a schematic circuit of the differential amplifier 50. The single-ended amplifier 50 includes a pair of p-channel input MOSFETs $M_1$, $M_2$, a pair of p-channel cascode MOSFETs $M_3$, $M_4$ and a current-mirror n-channel load, comprising n-channel MOSFETs $M_5$, $M_6$. The gate of the transistor $M_1$ is coupled to the output of the detector 48, and the gate of the transistor $M_2$ is set to the reference voltage $V_{ref}$. The gates of the cascode MOSFETs $M_3$, $M_4$ are set to a voltage $V_{ca}$. Exemplary values of the voltages $V_{ref}$ and $V_{ca}$ are 2.5 and 3.5 volts, respectively. The voltage $V_{dd}$ can be set to about 5 volts, and the voltage $V_{ss}$ can be set to ground. Other voltages may be appropriate for particular implementations.

To achieve high-speed BDI operation, the amplifier output resistance is kept low to increase the amplifier cut-off frequency. The gain of the amplifier 50 can be set, for example, to about 700 (56 dB) at 77 K. Such a high gain can be achieved by using transistors with large size to increase the transconductance and by using FETs with long device length to reduce short channel effects and provide a large output resistance. The cascode configuration can help reduce input-to-output capacitance and, thus, increase the speed of the amplifier. Also, by using a gain of about 700, the effective input capacitance of the amplifier 50 can be set at about 50 fF, in other words, less than the capacitance of the integration capacitor $C_{int}$. A read noise of less than 500 electrons, for example, as little as 300 electrons, can be associated with each photodetector. In general, the amplifier 50 is biased in the high gain region when operating as part of the BDI input circuit 44.

Other implementations are within the scope of the following claims.

What is claimed is:

1. An integrated circuit for reading out a signal from a sensor, the circuit comprising:
   a buffered direct injection input circuit including a differential amplifier with an injection transistor coupled between an input and output of the differential amplifier to provide active feedback, wherein the differential amplifier includes a pair of input transistors each of which has a respective gate, wherein the gate of one input transistor forms an input for a reference voltage and the gate of the other input transistor can be coupled to an output of the sensor, and wherein the differential amplifier further includes a pair of cascode transistors.

2. The integrated circuit of claim 1 wherein the cascode transistors are arranged to reduce an input-to-output capacitance of the differential amplifier.

3. The integrated circuit of claim 1 wherein each cascode transistor has a respective gate and source/drain regions, wherein the gates of the cascode transistors are electrically coupled to a common voltage and a source/drain region of each cascode transistor is coupled to a respective source/drain region of one of the input transistors.

4. The integrated circuit of claim 3 wherein each input transistor comprises a MOSFET.

5. The integrated circuit of claim 4 wherein each cascode transistor comprises a MOSFET having a channel of the same conductivity type as the input transistors.

6. The integrated circuit of claim 1 further including a current mirror load.

7. The integrated circuit of claim 6 wherein the differential amplifier has a gain of at least about 700.

8. The integrated circuit of claim 6 further including an integration capacitor, wherein, during operation, photocurrent from the sensor is injected onto the integration capacitor through the injection transistor.

9. The integrated circuit of claim 8 wherein the injection transistor is a FET.

10. The integrated circuit of claim 8 further including a feedback capacitor coupled between the output of the differential amplifier and the input transistor to which the sensor output can be coupled.

11. The integrated circuit of claim 10 wherein the differential amplifier has an effective input capacitance less than a capacitance of the integration capacitor.

12. The integrated circuit of claim 8 further including a screen transistor coupled between the injection transistor and the integration capacitor.

13. The integrated circuit of claim 12 wherein, during operation, the screen transistor is biased in saturation.

14. The integrated circuit of claim 12 wherein the integration capacitor can be reset by applying a reset voltage to a gate of a transistor in parallel with the integration capacitor.

15. The integrated circuit of claim 6 further including a feedback capacitor coupled between the output of the differential amplifier and the input transistor to which the sensor output can be coupled.

16. An infrared imager comprising:
   a plurality of infrared sensors; and
   readout circuits for reading out signals from the sensors, wherein each readout circuit includes a buffered direct injection input circuit including a differential amplifier with an injection transistor coupled between an input and output of the differential amplifier to provide feedback, wherein the differential amplifier includes a pair of input transistors each of which has a respective gate, wherein the gate of one input transistor is coupled to a reference voltage and the gate of the other input transistor is coupled to an output of one of the sensors, and wherein the differential amplifier further includes a pair of cascode transistors.

17. The imager of claim 16 wherein the cascode transistors are arranged to reduce an input-to-output capacitance of the differential amplifier.

18. The imager of claim 16 wherein each cascode transistor has a respective gate and source/drain regions, wherein the gates of the cascode transistors are electrically coupled to a common voltage and a source/drain region of each cascode transistor is coupled to a respective source/drain region of one of the input transistors.

19. The imager of claim 18 further wherein each readout circuit includes a current mirror load.

20. The imager of claim 19 wherein each sensor has a capacitance at least as high as 10 picofarads.

21. The imager of claim 19 wherein each readout circuit includes an integration capacitor, wherein, during operation, photocurrent from an associated one the sensors is injected onto the integration capacitor through the injection transistor.

22. The imager of claim 21 wherein each readout circuit includes a feedback capacitor coupled between an output of the differential amplifier and the input transistor to which the output of the associated one of the sensors is coupled.

23. The imager of claim 22 wherein the differential amplifier has an effective input capacitance less than a capacitance of the integration capacitor.

24. The imager of claim 23 wherein each readout circuit includes a screen transistor coupled between the injection transistor and the integration capacitor.

25. The imager of claim 24 wherein, during operation, the screen transistor is biased in saturation.

26. The imager of claim 24 wherein the integration capacitor can be reset by applying a reset voltage to a gate of a transistor in parallel with the integration capacitor.

27. The imager of claim 16 wherein the imager is a spectrometer.

28. A method of using an imager, the method comprising:
   detecting radiation with infrared sensors having respective capacitances at least as high as about 10 picofarads;
   injecting photocurrent from each sensor into an associated readout circuit having a buffered direct injection input circuit and an input impedance that is smaller than an impedance of the sensor; and
   sampling the photocurrent injected into each readout circuit at least once every 100 microseconds.

29. The method of claim 28 wherein noise associated with each sensor is less than about 300 electrons.

* * * * *